US011333698B2

(12) United States Patent
Liu et al.

(10) Patent No.: US 11,333,698 B2
(45) Date of Patent: May 17, 2022

(54) METHOD AND SYSTEM FOR FAST SEARCH OF CASCADING FAILURES IN HYBRID AC/DC POWER SYSTEMS

(71) Applicant: SHANDONG UNIVERSITY, Shandong (CN)

(72) Inventors: Yutian Liu, Jinan (CN); Yuanzhen Zhu, Jinan (CN); Wenbo Li, Jinan (CN)

(73) Assignee: SHANDONG UNIVERSITY, Shandong (CN)

( * ) Notice: Subject to any disclaimer, the term of this patent is extended or adjusted under 35 U.S.C. 154(b) by 78 days.

(21) Appl. No.: 16/640,786

(22) PCT Filed: Oct. 23, 2018

(86) PCT No.: PCT/CN2018/111311
§ 371 (c)(1),
(2) Date: Feb. 21, 2020

(87) PCT Pub. No.: WO2020/042307
PCT Pub. Date: Mar. 5, 2020

(65) Prior Publication Data
US 2020/0348353 A1    Nov. 5, 2020

(30) Foreign Application Priority Data
Aug. 30, 2018   (CN) .......................... 201811000018.6

(51) Int. Cl.
*G01R 31/08* (2020.01)
*H02J 13/00* (2006.01)
*H02J 4/00* (2006.01)

(52) U.S. Cl.
CPC .............. *G01R 31/086* (2013.01); *H02J 4/00* (2013.01); *H02J 13/00002* (2020.01)

(58) Field of Classification Search
CPC .. G01R 31/086; H02J 3/001; H02J 13/00002; H02J 4/00; H02J 3/00; H02H 7/28;
(Continued)

(56) References Cited

U.S. PATENT DOCUMENTS 7,231,280 B2 *  6/2007  Costa ........................ H02J 3/14
                                                          700/286
9,575,854 B1 *  2/2017  Liu ........................ G06F 11/203
(Continued)

FOREIGN PATENT DOCUMENTS

CN    103166219 A    6/2013
CN    105354675 A    2/2016
(Continued)

OTHER PUBLICATIONS

Jun. 3, 2019 Search Report issued in International Patent Application No. PCT/CN2018/111311.
(Continued)

*Primary Examiner* — Vinh P Nguyen
(74) *Attorney, Agent, or Firm* — Oliff PLC

(57) ABSTRACT

A fast search method and system for cascading failures in hybrid AC/DC power systems. The fast search method for cascading failures in hybrid AC/DC power systems includes: Determining the initial failures and forming a failure set of the first-stage failure, setting the DC blocking or the failure level reaching the threshold as the search stop condition; Judge the cascading failures in the failure set of the current stage can trigger DC blocking, if a cascading failure can trigger DC blocking, store the DC blocking failure as the next-stage failure. Otherwise, cascading failures are searched on the AC side and the failure set of the next stage is determined based on the pruning search method and the outage risk value; If the search stop condition is satisfied, stop the search, otherwise, the number of failure stages is
(Continued)

increased by one and return to judge the cascading failures to continue the search.

9 Claims, 3 Drawing Sheets

(58) Field of Classification Search
CPC ........ Y04S 10/52; Y04S 20/222; Y04S 50/10; Y04S 10/30; Y04S 20/20; G06F 11/2007; G06F 11/203; G06F 11/2035; G06F 11/2048; G06F 17/50; G06F 11/0709; G06F 11/079; G06F 11/1629; G06F 11/2023; G06F 11/2033; G06F 11/2268; G06F 11/3006; G06F 11/3409; G06F 11/321; G06F 2201/805; G06F 2201/82; G06F 2201/85; G06F 11/3466; G06F 11/3612; G06F 11/3644; G06F 11/3664; G06F 11/3688; G06F 21/577; G06F 2119/02; G06F 30/3323; G06Q 10/06; G06Q 50/06
See application file for complete search history.

(56) References Cited

U.S. PATENT DOCUMENTS

| | | | |
|---|---|---|---|
| 9,746,511 B2* | 8/2017 | Wang | G01R 31/085 |
| 9,772,898 B2* | 9/2017 | Deshpande | H04L 41/065 |
| 10,139,844 B1* | 11/2018 | Hoffmann | G05B 15/02 |

FOREIGN PATENT DOCUMENTS

| | | |
|---|---|---|
| CN | 106056466 A | 10/2016 |
| CN | 106327034 A | 1/2017 |

OTHER PUBLICATIONS

Jun. 3, 2019 Written Opinion issued in International Patent Application No. PCT/CN2018/111311.

* cited by examiner

METHOD AND SYSTEM FOR FAST SEARCH OF CASCADING FAILURES IN HYBRID AC/DC POWER SYSTEMS

FIELD OF THE INVENTION

The present invention belongs to the field of power system failures, and in particular relates to a method and system for fast search of cascading failures in hybrid AC/DC power systems.

BACKGROUND OF THE INVENTION

Since the beginning of the 21st century, there have been many large blackouts in the world, such as the U.S.-Canada blackout on Aug. 14, 2003 and the Australia blackout on Sep. 28, 2016. These blackouts have brought great harm to people. In order to avoid large blackouts, close attention should be paid to the operation of power systems. Possible failures should be anticipated, then preventive and control measures should be taken in advance.

Voltage collapse is one of the major reasons of power system blackouts. When the power system is severely disturbed, the voltage of some buses in the system may undergo a large and continuous decrease, which will destroy the integrity of the system, cause voltage collapse and result in catastrophic consequences. For modern power systems, it is only possible to cause a voltage collapse when a sequential failure occurs. Cascading failure is a special case of sequential failures. A cascading failure is a clear causal relationship between front and rear failures. The previous failure changes the state of the system and triggers the next failure.

At present, the research on cascading failures mainly includes two aspects: complex network theory and complex power system analysis. Among them, the complex network theory mainly studies the influence of network topology on cascading failures, such as small world network theory and scale-free network theory. Complex power system analysis mainly considers the operational characteristics and power flow constraints of the actual power system, such as OPA model based on DC optimal power flow, Manchester model based on AC power flow, CASCADE model, hidden failure model and so on. However, the traditional cascading failure analysis has the following problems:

(1) The traditional cascading failure analysis is carried out for the AC system. In recent years, due to the rapid development of DC systems and the commissioning of multiple DC lines, it is necessary to analyze the cascading failure of the AC/DC systems. The existing analytical methods of cascading failures are not applicable to AC/DC systems.

(2) The actual AC/DC systems have a large scale. The traditional analysis method requires a lot of time to analyze cascading failures.

SUMMARY OF THE INVENTION

In order to solve the deficiencies of the existing technologies, the present invention provides a fast cascading failure search method in hybrid AC/DC power systems, which can greatly reduce the search space and improve the search efficiency while ensuring the accuracy of the search based on the pruning search on the AC side and fast judgement of AC failure impacts on DC systems.

The present invention proposes a fast search method for cascading failures in hybrid AC/DC power systems, comprising the following steps:

Step 1: Determining the initial failure and forming a failure set of the first-level failures. Setting the DC blocking or the number of failure levels reaching the threshold as the search stop condition;

Step 2: Judging whether cascading failures in the current stage failure set can trigger DC blocking. If a cascading failure causes DC blocking, the DC blocking failure is stored in the next stage failure set. Otherwise, cascading failures are searched on the AC side and the failure set of the next stage is determined based on the pruning search method with the outage risk value used as the pruning basis. Step 3: Judging whether the search stop condition is satisfied. If the search stop condition is satisfied, stop the search. Otherwise, the number of failure stages is increased by one and return to Step 2 to continue the search.

Further, in the Step 1, according to the actual situation of the system, the AC lines in the vicinity of the DC terminal location are selected as the initial failures in the cascading failure search, and the initial failures are simulated by the time-domain simulation to check whether they can trigger DC blocking.

For example, suppose the failure of line j in the system be $c_j$, the ith failure chain of m stages is $l_i = c_1 - c_2 - c_3 - \ldots$. The number of failures in this failure chain is m. And the failure set of m stages is $L_m = \{l_1, l_2, \ldots l_i, \ldots\}$.

Further, in the step 2, when judging whether cascading failures in the current-stage failure set can trigger DC blocking, extreme failures are identified by comparing the multi-infeed short circuit ratio (MISCR) with the preset threshold of MISCR. Then, these extreme failures are judged whether causing DC blocking by time-domain simulations.

In the present invention, the threshold of MISCR is set according to the actual system situation. If the MISCR of the power system is lower than the threshold after a failure, which indicates that the failure has a serious impact on the DC system. The transient time-domain simulation is utilized to judge whether triggering DC systems block.

Further, in the step 2, when judging whether cascading failures of the current-stage failure set can trigger DC blocking, the non-extreme failures are fast judged whether can trigger DC blocking by the LM neural network (LMNN).

For the non-extreme failures, the present invention uses the LMNN to quickly evaluate the influence of these failures on the DC system, which avoids a large number of detailed time-domain simulations.

Among them, LMNN is a supervised neural network based on LM algorithm, which has the advantages of high fitting precision and fast training speed. The voltage traces from 0.1 second before the failure to 0.3 second after the failure are as inputs and the quantitative voltage dip degree after failure is as the output.

Further, for non-extreme failures, the specific process of using the LMNN to fast judge whether the current-stage failures can trigger DC blocking is:

Partitioning the AC/DC power system to be analyzed. The partition principle is that each DC system terminal location is as one area. Cascading failure chains of different stages are randomly selected near the vicinity of the DC terminal location and as a training sample set.

For the randomly generated training sample set, extreme cascading failure chains are removed, and the remaining non-extreme cascading failure chains are used for training of LMNN.

The trained LMNN is utilized to quickly estimate the voltage dip degree of the commutation bus after failures and measure the severity of AC failures.

For cascading failures whose severity exceeds the preset threshold, time-domain simulation is used to verify whether they can cause DC blocking.

Further, in the process of using the LMNN to quickly estimate whether the current-stage non-extreme failures can trigger DC blocking, failure chains are sorted according to the severity of each AC failure. The most serious failure is simulated by the time-domain simulation. If the failure will trigger DC blocking, next failure is simulated continually. Otherwise, there is no need to simulate the remaining failures.

Further, in the Step 2, the pruning search method is used, and the pruning condition is based on the outage risk value. The process of searching the next-stage failures on the AC side is:

Calculate the remaining line outage risk for each failure chain in turn.

Take the line outage risk value as the pruning condition, the corresponding failure chains are sorted according to the outage risk value.

The preset number of failure chains are stored and complete a pruning process, then the next-stage failures are searched on the AC side system.

Further, in the process of calculating the remaining line outage risk for each failure chain, the calculation is based on two aspects: the line outage probability and the line outage consequence.

Or in the process of calculating the remaining line outage risk for each failure chain, the calculation is based on a single line outage probability or a single line outage consequence.

Further, the line outage probability considers the influence of line load rate and hidden failures of protection systems. The higher the line load rate is, the greater the probability of outage is. The fluctuation of line power flow and heavy load of AC lines will trigger hidden failures of protection systems. The more severe the fluctuation of line power flow is and the higher the load rate is, the greater the possibilities of hidden failures are.

The load rate and distribution of remaining lines after a line outage are defined as the consequences of the line outage. The line outage distribution factors (LODF) method is used to calculate the power flow after line outages.

The present invention also provides a fast cascading failure search system in hybrid AC/DC power systems.

The system for fast cascading failure search in hybrid AC/DC power systems includes memory and processor. The processor is configured to perform the following steps:

Determine initial failures and form a failure set of the first stage. Set DC blocking or the number of failure stages reaching a threshold as the search stop condition.

Estimate whether each cascading failure in the current stage can trigger DC blocking. If a failure chain will trigger DC blocking, store the DC blocking as the next stage failure. Otherwise, use the pruning search method and the outage risk value as the pruning condition to search for failures on the AC side and determine the failure set of the next stage.

Judge whether the search stop condition is satisfied, and if the condition is satisfied, the search is stopped. Otherwise, the number of failure stages is increased by one and return to the previous step to continue the search.

Compared with the existing technologies, the beneficial effects of the present invention are:

(1) The present invention considers the influence of multi-infeed DC systems in the cascading failure search. In view of the different failure mechanisms of the AC system and the DC system in the hybrid AC/DC system, AC side cascading failure search and DC blocking fast judgment are carried out iteratively based on the propagation mechanism of the AC/DC cascading failures. Then, a cascading failure search system in hybrid AC/DC power systems is established for high-risk cascading failure chain search.

(2) The fast search method for the cascading failures in hybrid AC/DC power systems proposed by the invention comprises the two parts which are the AC side cascading failure search and the DC blocking fast judgment. These two parts are alternately performed in the search process until the stop condition is reached. The present invention takes both the AC side and the DC side cascading failure search into consideration, and the search process has been accelerated from these two aspects.

(3) The fast cascading failure search in hybrid AC/DC power systems proposed in the invention is based on the line outage risk value and the pruning search method on the AC side, which can greatly reduce the search space and improve the search efficiency.

(4) The present invention realizes the fast judgment of the DC blocking and proposes a fast evaluation method of the AC failure effect on the DC system, which can effectively reduce the time of the time-domain simulation.

BRIEF DESCRIPTION OF THE DRAWINGS

The drawings constituting a part of the present application are used for providing a further understanding of the present application, and illustrative embodiments of the present application and the explanations thereof are used for interpreting the present application, and do not constitute undue limits to the present disclosure.

DETAILED DESCRIPTION OF THE EMBODIMENTS

It should be noted that the following detailed descriptions are illustrative and are intended to provide a further description of the present disclosure. Unless otherwise indicated, all technical and scientific terms used herein have the same meanings as commonly understood by those of ordinary skill in the art to which the present application belongs.

It should be noted that the terms used herein are merely for the purpose of describing particular embodiments, rather than limiting the exemplary embodiments of the present disclosure. As used herein, unless otherwise explicitly stated in the context, a singular form is intended to include plural forms. In addition, it should also be understood that when the terms "comprise" and/or "include" are used in the specification, they indicate the presence of features, steps, operations, devices, components, and/or combinations thereof.

Figure 1:
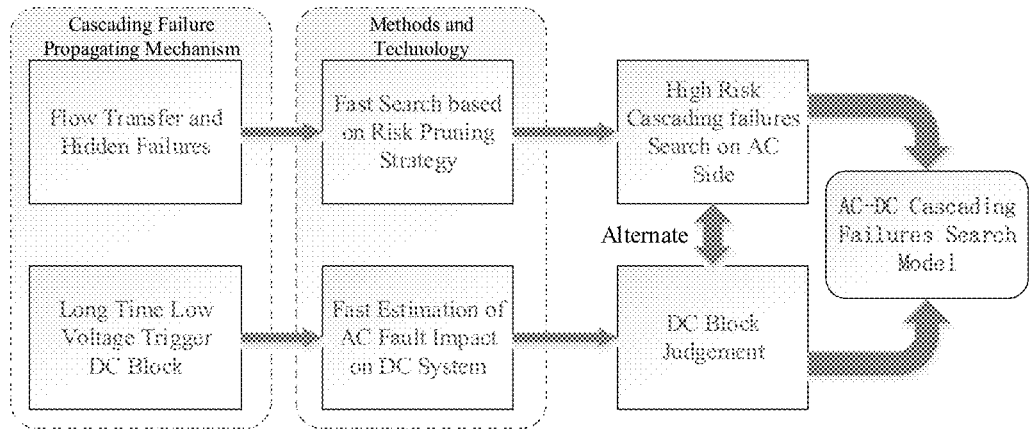
FIG. 1 illustrates flowchart of the fast search of AC/DC cascading failure chains.

FIG. 1 is a flowchart of the fast search of AC/DC cascading failure chains. As shown in FIG. 1, in view of the different failure mechanisms of the AC system and the DC system in the hybrid AC/DC system, AC side cascading failure search and DC blocking fast judgment are carried out iteratively to search high-risk cascading failure chains. Based on the pruning search on the AC side and fast judgement of AC failure impacts on DC systems, the present invention can greatly reduce the search space and improve the search efficiency.

Figure 2:
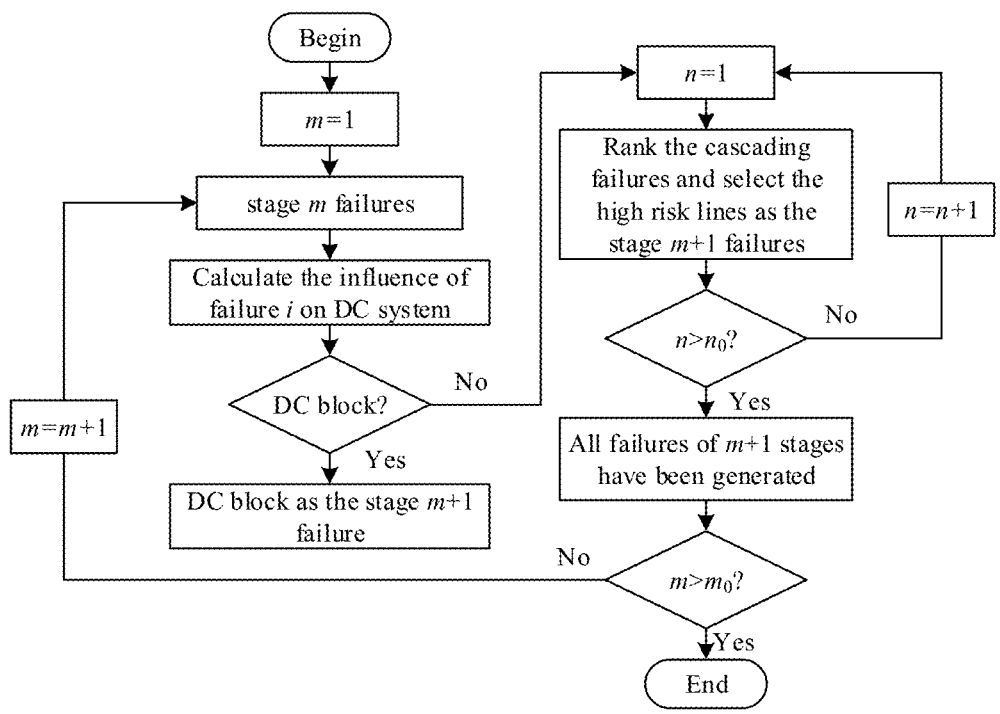
FIG. 2 illustrates the flowchart of AC/DC cascading failure chain search.

As shown in FIG. 2, a fast search method for cascading failures in hybrid AC/DC power systems according to the present invention includes:

Step 1: Determining the initial failure and forming a failure set of the first stage failures. Setting the DC blocking or the number of failure levels reaching the threshold as the search stop condition.

Wherein, the search stop condition is DC blocking or number of failure stages m reaching the threshold. When the DC system blocks, the receiving end system will face a large amount of power shortage and must be stabilized by the load shedding, which will result in a large area power outage. When the number of cascading failure stages m is large, the probability of occurrence will become extremely small. At this time, the meaning of continuing the search is not significant. Thus, it is necessary to set the threshold of the search stage number as the search stop condition.

In this step, the AC lines near the commutation bus of the DC system are selected as the initial failure lines. When a line fails, its power flow will transfer to the adjacent lines, and the cascading failure will propagate in the vicinity of the DC system. If multiple lines near the commutation bus are disconnected, the support capacity of the AC system for the DC system will be greatly reduced. The closer the distance between short circuit fault point and the commutation bus is, the more severe the influence of the commutation bus is. Therefore, the impact of line failures in the vicinity of the DC system are more serious. It is reasonable to set these failures as initial failures. After the initial failures are determined, these initial failures are simulated by the time-domain simulation to check whether it will trigger DC blocking.

For example, suppose the failure of line j in the system be $c_j$, the ith failure chain of m stages is $l_i = c_1 - c_2 - c_3 - \ldots$. The number of failures in this failure chain is m. And all failure sets of m stages are $L_m = \{l_1, l_2, \ldots l_i, \ldots\}$.

Step 2: Judge the cascading failures in the failure set of the current stage can trigger DC blocking. If a cascading failure can trigger DC blocking, store the DC blocking failure as the next-stage failure. Otherwise, based on the pruning search method and the outage risk value, cascading failures are searched on the AC side and the failure set of the next stage is determined.

Specifically, in this step, the process of judging whether cascading failures of the current stage failure set is performed in two steps. The first step is to identify the extreme AC failures and they are simulated by the time-domain simulation to determine whether there are failures that can trigger DC blocking. The second step is to use the voltage trace of 0.4 second before and after the fault as input and the LMNN is utilized to fast estimate the voltage dip degree of the commutation bus after failures. The voltage dip degree is used to measure the severity of the AC failure impact on the DC system. The severe failures in these AC failures are simulated by the time-domain simulation to check whether they will trigger DC blocking.

(1) For extreme failures:

Some extreme AC failures greatly reduce the support capacity of the AC system to DC systems, which will result in transient voltage instability near DC terminal locations and cause the DC system block. Therefore, these extreme failures should be identified first and simulated by the time-domain simulation separately.

In the present invention, extreme failures are identified by comparing the MISCR with the preset threshold of MISCR. Then, these extreme failures are judged whether can cause DC blocking by time-domain simulations.

In the present invention, the threshold of MISCR is set according to the actual system situation. If the MISCR of the power system is lower than the threshold after a failure, which indicates that the failure has a serious impact on the DC system. The time-domain simulation is utilized to judge whether DC systems block.

The support capacity of the AC system to DC systems can be characterized by the short-circuit ratio. For multi-infeed DC systems, the MISCR can be used to identify extreme AC failures. The expression of MISCR is as follows:

$$M_i = \frac{S_{aci}}{P_{deqi}} = \frac{1}{|Z_{eqii}|P_{di} + \sum_{j=1, j \neq i}^{n} |Z_{eqij}|P_{dj}} \quad (1)$$

where $S_{aci}$ is the short-circuit capacity as seen from the commutation bus i; $P_{deqi}$ is DC power of the ith DC system, MW; $Z_{eqii}$ is the self-impedance of the commutation bus i; $Z_{eqij}$ is the mutual impedance of the commutation bus i and bus j; $P_{di}$ is the power of DC system i, $P_{dj}$ is the power of DC system j.

When multiple lines near the commutation bus are disconnected, the MISCR will decrease which indicates that the support capacity of AC systems to DC is degraded. Assuming $M_{th}$ is the value of MISCR after a failure, if $M_{th} < 2.5$, the failure is considered to be an extreme AC failure. It can be verified by time-domain simulation whether this failure can trigger DC blocking.

(2) For non-extreme failures:

The LMNN is used to fast assess the effects of AC failures. Extreme AC failures account for only a very small portion of cascading failures. Most failures are difficult to evaluate by using MISCR and other steady-state indicators. The voltage dip degree of the commutation bus and the recovery after failures can reflect the influence of failures on the DC system. Therefore, the present invention takes the voltage trace information of 0.1 second before the failure to 0.3 second after the failure as inputs. The quantitative voltage dip degree of the commutation bus is as the output. The LMNN is trained by the inputs and outputs, which can be used to fast assess the effects of AC failures on DC systems. The traditional time-domain simulation needs to simulate the voltage waveform of 10 second and the present method only needs to simulate 0.4 second, which greatly reduces the calculation time.

For the non-extreme failures, the present invention uses the LMNN to quickly evaluate the influence of these failure on the DC system, which avoids a large number of detailed transient time-domain simulations.

Among them, LMNN is a supervised neural network based on LM algorithm, which has the advantages of high fitting precision and fast training speed. The voltage traces from 0.1 second before the failure to 0.3 second after the failure are as inputs and the quantitative voltage dip degree after failure is as the output.

The LM algorithm belongs to the trust region algorithm, which combines the gradient descent method and the Gauss-Newton method and has both the local convergence characteristic of the Gauss-Newton method and the global characteristics of the gradient descent method.

The output of the LMNN is the voltage dip degree after the failure. It must first be quantified and expressed by the area $dS_i$ that the voltage after the failure exceeds the normal voltage value, which is expressed as:

$$dS_i = \begin{cases} (0.9-V) \times T_i & V < 0.9 \\ (V-1.05) \times T_i & V > 1.05 \\ 0 & 0.9 < V < 1.05 \end{cases} \quad (2)$$

$$S_V = \sum_{i=1}^{T_N} dS_i \quad (3)$$

where, $T_i$ represents the ith time point after the failure, $T_N$ represents the total number of time points, and $S_V$ represents the area that the commutation bus voltage after the failure exceeds the normal voltage to quantify the degree of voltage fluctuation.

After defining the voltage fluctuation degree index, the index is used as the output and the voltage traces of 0.1 second before the failure to 0.3 second after the failure are as inputs. The simulated samples are trained to obtain the LMNN. Since the voltage has local property, a neural network can be trained for each local system near the DC terminal location to improve the accuracy of the prediction.

Specifically, for non-extreme failures, the process of using the LMNN to fast judge whether the current-stage failures can trigger DC blocking is:

Partition the AC/DC power system to be analyzed. The partition principle is that each DC system terminal location is as one area. Cascading failure chains of different stages are randomly selected near the vicinity of the DC terminal location and as a training sample set.

For the training sample set, extreme cascading failure chains are removed, and the remaining non-extreme cascading failure chains are used for training of LMNN.

The trained LMNN is utilized to quickly estimate the voltage dip degree of the commutation bus after failures and measure the severity of AC failures.

For cascading failures whose severity exceeds the preset threshold, time-domain simulation is used to verify whether they can cause DC blocking.

In the process of using the LMNN to quickly estimate whether the current-stage non-extreme failures can trigger DC blocking, failure chains are sorted according to the severity of each AC failure. The most serious failure is simulated by the time-domain simulation. If the failure will trigger DC blocking, next failure is simulated continually. Otherwise, there is no need to simulate the remaining failures.

Specifically, the process of searching for the next-stage failures on the AC side by using the pruning search method and using the outage risk value as the pruning condition is:

(1) Assume that there are N lines in the system and a total of n failure chains are obtained. Each failure chain contains k failures, which is a failure chain of k stages. For each failure chain, the number of remaining lines in the system is N-k. For each failure chain, the remaining line outage risks are calculated sequentially.

(2) The corresponding failure chains are sorted according to the outage risk and the top N failure chains with higher risk are retained. Cascading failure chains of k+1 stages are obtained and a pruning process is completed. Then search the next-stage failure set on the AC side.

In an embodiment, in the process of calculating the remaining line outage risk for each failure chain, the calculation is based on two aspects: the line outage probability and the line outage consequence.

Among them, the line outage probability considers the influence of line load rate and hidden failures of protection systems. The higher the line load rate is, the greater the probability of outage is. The fluctuation of line power flow and heavy load of AC lines will trigger hidden failures of protection systems. The more severe the fluctuation of line power flow is and the higher the load rate is, the greater the possibilities of hidden failures are.

The load rate and distribution of the remaining lines after a line outage are defined as the consequences of the line outage. The LODF method is used to calculate the power flow after line outages.

Figure 3:
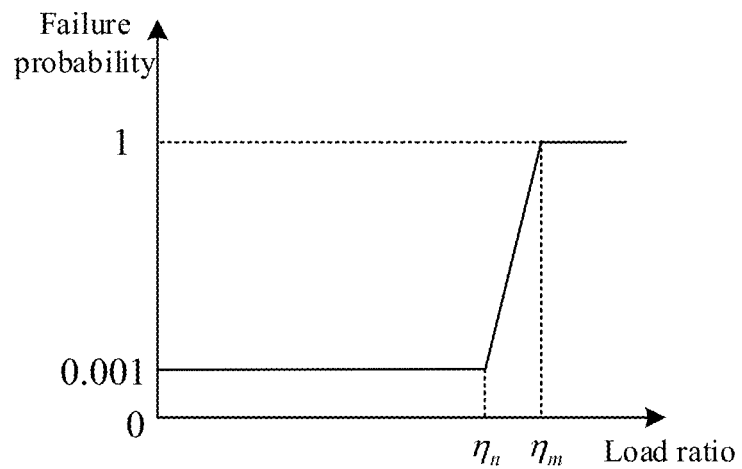
FIG. 3 illustrates the relationship between line load rate and failure probability.

Line failures are considered from two aspects: load rate and hidden failures of protection systems, which are the key factors that cause cascading failures. The load flow transfer will increase the load rate of some lines. The relationship between the load rate and the component failure probability is as shown in FIG. 3. The relationship can be expressed as:

$$p_i^{ol} = \begin{cases} 0.001 & \eta_i \le 0.8 \\ 0.001 + 0.999 \dfrac{\eta_i - 0.8}{1.4 - 0.8} & 0.8 < \eta_i < 1.4 \\ 1 & \eta_i \ge 1.4 \end{cases} \quad (4)$$

where $\eta_i$ is the load ratio of line i after failures, $p_{oli}$ is the failure probability of line I after failures.

Hidden failures of protection systems may cause malfunction or refusal of the protection device. Due to there are multiple backup protections, the impact of the refusing actions of protective devices is small meanwhile the occurrence probability is low. Therefore, the present invention mainly considers the impact of wrong actions. When the system is disturbed (operation mode changes, sharp load fluctuations, etc.), hidden failures of protection systems will be triggered.

The hidden failure probability is expressed as $$p_i^{hf} = \omega \eta_i^m (\eta_i^m - \eta_i^{m-1}) \ (m \ge 1) \quad (5)$$

where $P_i^{hf}$ is the hidden failure probability of line i after the m-stage failure, $\eta_i^m$ is the load ratio of line i after the m-level failure, $\eta_i^{m-1}$ the load ratio of line i before the m-level failure, and $\omega$ is the weight factor, which is mainly related to the line environment, line length, running time and other factors. The present invention assumes $\omega$ is 0.2.

Both of heavy load failure probabilities and hidden failure probabilities are considered. The line outage probability of line i can be expressed as $$p_i = 1 - (1 - p_i^{hf})(1 - p_i^{ol}) \quad (6)$$

Line outage risk includes line failure probability and consequences of line outage. The consequence of line i outage is shown as follows:

$$I_i^m = \sum_{j=1,j\neq i}^{n} \exp(2\eta_{ij}^{m+1} + \Delta\eta_{ij}^{m+1}) \quad (7)$$

where $I_i^m$ represents the consequence caused by the line i failure; $\eta_{ij}^{m+1}$ is the load rate of line j after the line i failure; $\Delta\eta_{ij}^{m+1}$ represents the load rate change of line j before and after the line failure.

It is time-consuming when calculating consequences of line outage by AC power flow method. Thus, the LODF method is adopted in power flow calculation after line outages. LODF method has a high accuracy if only one line is broken, which is suitable for the case of this invention. After the next stage failure is determined, a power flow calculation is performed using the PQ decomposition method. The mutual iteration method of LODF and PQ decomposition will balance the speed and accuracy.

The risk of failure chains is shown as:

$$R_i^m = p_i^m \times I_i^m \quad (7)$$

The cascading failure search can be performed after defining the line outage probability and the risk of failure chains. The breadth first search strategy is adopted in the search process. After a failure is determined, all next-stage failures are searched, and lower stage failures are searched until the stop condition is reached. Due to there are a large number of components in the hybrid AC/DC power system, it is impossible to search out all failures in every stage, which wastes a lot of time and is of little significance to dispatching and controlling personnel. The goal of cascading failure search in hybrid AC/DC power system is to give high-risk cascading failure chains then prevent and control them. Therefore, it is necessary to pruning in the cascading failure search process to narrow the search space and improve the search speed.

In another embodiment, the remaining line outage risk for each failure chain is calculated from a single aspect of the line outage probability or the line outage consequence.

Step 3: Determine whether the search stop condition is satisfied. If the search stop condition is satisfied, stop the search. Otherwise, the number of failure stages m is increased by one and return to Step 2 to continue the search.

The following is a simulation of the simplified planning operation mode of Shandong power system to illustrate the process of the fast search of AC/DC cascading failures.

Figure 4:
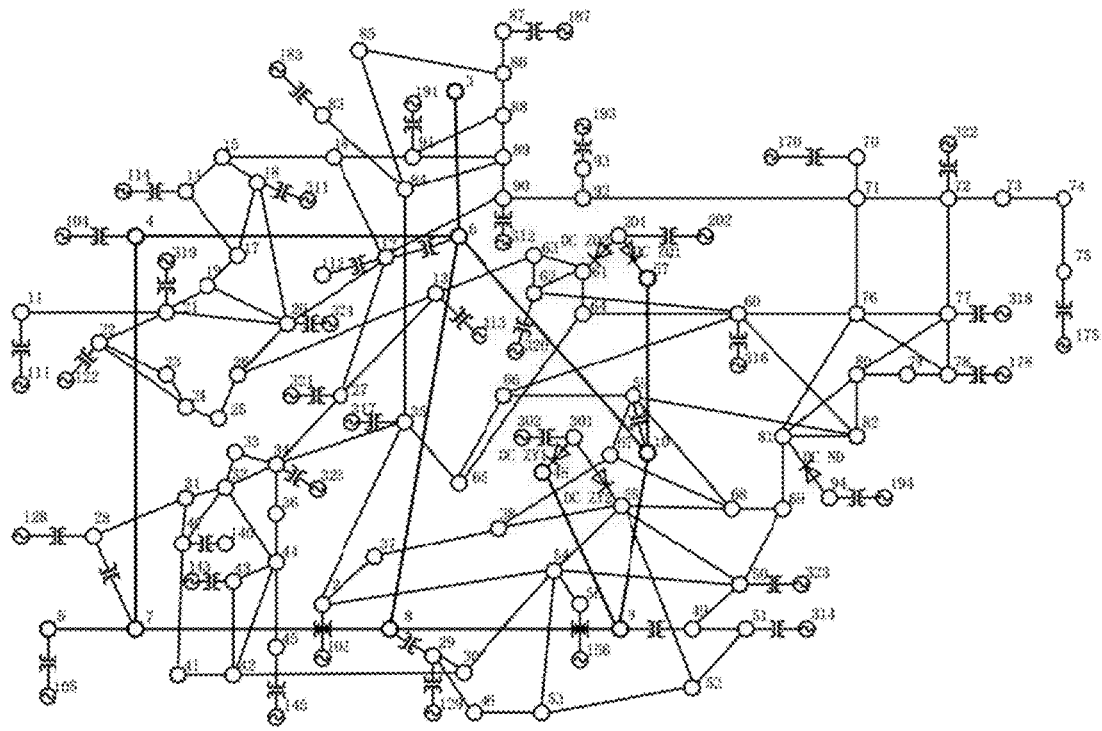
FIG. 4 illustrates the structure of the Shandong power system.

The structure of the simplified Shandong hybrid AC/DC power system of China is shown in FIG. 4. The total load of the power system is 63.97 GW. The receiving DC power is 20 GW and the AC power from outside systems is 4.6 GW. The total generation of generators in Shandong province is 39.49 GW. Only 500 kV and above AC and DC lines are considered in the power system. In the power system, the number of 500 kV and above AC lines is 245, the number of buses and DC lines are 90 and 3, respectively. The specific steps of AC/DC cascading failure search are shown as follows:

S1: Choose the initial failures around DC Ningdong commutation bus. It can be seen from FIG. 4 that AC lines which contact with DC Ningdong commutation bus directly are 69-81, 76-81, 80-81, 81-82. Choose line 81-82 as the initial failure line to search cascading failures. The time-domain simulation result shows that the three-phase fault of line 81-82 will not lead to DC block.

S2: Search AC/DC cascading failures in the AC side. Calculate and rank the outage risk of remaining lines after line 81-82 outage. Keep the top 20 failure chains and get a 2-stage failure chain set. Similarly, in the subsequent search, calculate line outage risks of remaining lines and rank the corresponding failure chains. Top N failure chains are retained to obtain the k-stage failure chain set.

In order to verify the validity of the method, the cascading failure search of the AC side is carried out without considering the influence of the AC failures on the DC system. When N is different, the probability distribution of the top 200 failure chains with the highest probabilities is searched. Comparing the search results of N=60 and N=800, the results show that the top 64 failure chains with the highest probabilities are the same. The probability of the first failure chain is much larger than the failure chains after the ranking of 200. Therefore, it is necessary to focus on the analysis of the top 200 failure chains with the highest probabilities.

The results show that the smaller the N is, the shorter the search time is. To balance the accuracy and search time, N should not be larger or smaller. Therefore, the search process can set N to 60, and the time spent is 8.74% at N=800.

S3: 2100 5-stages failure chains are randomly generated in the vicinity of the DC Ningdong commutation bus, of which 1900 are used as training samples and 200 are used as test samples. The proposed method for fast estimation of AC failure impact on DC systems are used to evaluate these samples.

1. Identify the extreme failures. The threshold of MISCR is set to 2.5. There are 3 extreme failure chains in the training samples and 1 in the test samples. The extreme failure chain in the test samples is: 80-81(1)→80-81(2)→81-82→69-81(2)→69-81(2). After the first four failures, four lines near the DC Ningdong commutation bus are cut off, which lead to the commutation bus voltage drop to about 0.93 p.u. After the fifth-stage failure occurred, the voltage fluctuated greatly, which triggers the DC Ningdong blocking.

2. Taking out extreme failure chains, the LMNN is trained using the remaining 1897 training samples. The AC/DC cascading failure search is carried out with 81-82 as the initial failure. The top 200 5-stage failure chains with the highest probabilities are analyzed, of which 91 are extreme failure chains and 109 are non-extreme failure chains. When simulating extreme failure chains, the order of the first four failures is not considered and a total of 20 time-domain simulations are needed. For the non-extreme failure chains, the LMNN obtained by the training is quickly calculated to determine whether DC blocking is triggered. The results show that a total of 16 failure chains will trigger DC blocking.

S4: After repeated iterations of S2 and S3, a total of 16 high-probability failure chains that can cause DC blocking are obtained, which are shown as follows:

| Initial failures | 2$^{nd}$ failure | 3$^{rd}$ failure | 4$^{th}$ failure | 5$^{th}$ failure | Failure chain probabilities (10$^{-7}$) |
|---|---|---|---|---|---|
| 81-82 | 80-81(1) | 76-81 | 80-81(2) | 69-81(1) | 2.035 |
| 81-82 | 80-81(2) | 76-81 | 80-81(1) | 69-81(1) | 2.034 |
| 81-82 | 80-81(1) | 76-81 | 80-81(2) | 69-81(2) | 1.826 |
| 81-82 | 80-81(2) | 76-81 | 80-81(1) | 69-81(2) | 1.826 |
| 81-82 | 76-81 | 80-81(2) | 80-81(1) | 69-81(1) | 0.876 |
| 81-82 | 76-81 | 80-81(1) | 80-81(2) | 69-81(1) | 0.876 |
| 81-82 | 80-81(1) | 80-81(2) | 76-81 | 69-81(1) | 0.790 |
| 81-82 | 80-81(2) | 80-81(1) | 76-81 | 69-81(1) | 0.790 |
| 81-82 | 76-81 | 80-81(2) | 80-81(1) | 69-81(2) | 0.786 |
| 81-82 | 76-81 | 80-81(1) | 80-81(2) | 69-81(2) | 0.786 |
| 81-82 | 80-81(1) | 80-81(2) | 76-81 | 69-81(2) | 0.718 |
| 81-82 | 80-81(2) | 80-81(1) | 76-81 | 69-81(2) | 0.718 |
| 81-82 | 80-81(1) | 76-81 | 69-81(1) | 80-81(2) | 0.483 |

-continued

| Initial failures | 2$^{nd}$ failure | 3$^{rd}$ failure | 4$^{th}$ failure | 5$^{th}$ failure | Failure chain probabilities (10$^{-7}$) |
|---|---|---|---|---|---|
| 81-82 | 80-81(2) | 76-81 | 69-81(1) | 80-81(1) | 0.482 |
| 81-82 | 80-81(1) | 76-81 | 69-81(2) | 80-81(2) | 0.465 |
| 81-82 | 80-81(2) | 76-81 | 69-81(2) | 80-81(1) | 0.464 |

These cascading failure chains will trigger DC blocking and have high probabilities. The cascading failure search stops and focus on these high-risk failure chains that will trigger DC blocking.

Figure 5:
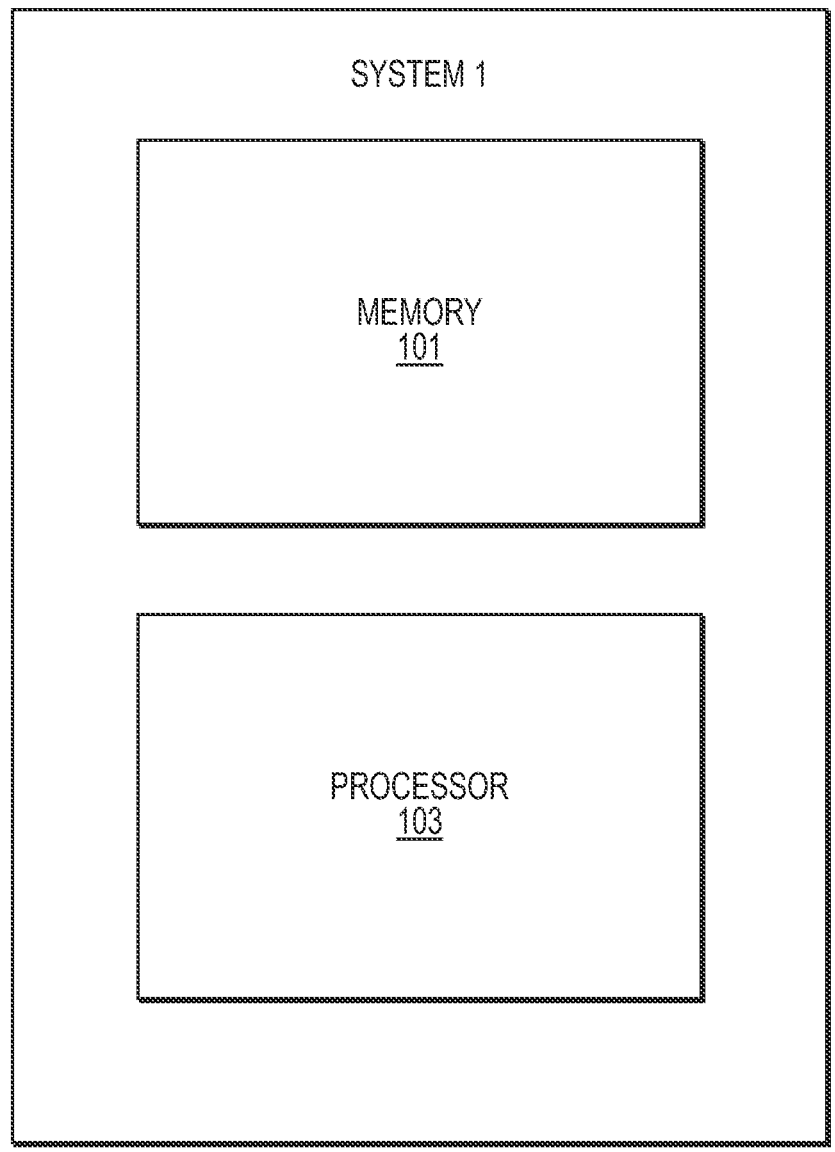
FIG. 5 is a block diagram that illustrates a configuration of a system for fast search of cascading failure in hybrid AC/DC power systems.

The present invention also provides a system 1 for fast search of cascading failure in hybrid AC/DC power systems, as illustrated in FIG. 5.

The system 1 for fast search of cascading failure in hybrid AC/DC power systems includes memory 101 and processor 103. The processor 103 is configured to perform the following steps:

Determine initial failures and form a failure set of the first stage. Set DC blocking or the number of failure stages reaching a threshold as the search stop condition.

Estimate whether each cascading failure in the current stage can trigger DC blocking. If a failure chain will trigger DC blocking, store the DC blocking as the next stage failure in the memory 101. Otherwise, use the pruning search method and the outage risk value as the pruning condition to search for failures on the AC side and determine the failure set of the next stage.

Judge whether the search stop condition is satisfied, and if the condition is satisfied, the search is stopped. Otherwise, the number of failure stages is increased by one and return to the previous step to continue the search.

The present invention considers the influence of multi-infeed DC systems in the cascading failure search. In view of the different failure mechanisms of the AC system and the DC system in the hybrid AC/DC system, AC side cascading failure search and DC blocking fast judgment are carried out iteratively based on the propagation mechanism of the AC/DC cascading failures. Then, a hybrid AC/DC cascading failure search system is established for high-risk cascading failure chain search.

The fast search method for the cascading failures in hybrid AC/DC power systems proposed by the invention comprises the two parts which are the AC side cascading failure search and the DC blocking fast judgment. These two parts are alternately performed in the search process until the stop condition is reached. The present invention takes both the AC side and the DC side cascading failure search into consideration, and the search process has been accelerated from these two aspects.

The fast search for cascading failures search in hybrid AC/DC power systems proposed in the invention is based on the line outage risk and the pruning search method on the AC side, which can greatly reduce the search space and improve the search efficiency.

The present invention realizes the fast judgment of the DC blocking and proposes a fast evaluation method of the AC failure effect on the DC system, which can effectively reduce the time of the time-domain simulation.

Although the detailed embodiments of the present invention are described above in combination with the accompanying drawings, the protection scope of the present invention is not limited thereto. It should be understood by those skilled in the art that various modifications or variations could be made by those skilled in the art based on the technical solution of the present invention without any creative effort, and these modifications or variations shall fall into the protection scope of the present invention.

The invention claimed is:

1. A fast search method for cascading failures in hybrid AC/DC power systems, the method comprising steps of:
   step 1: determining, using a processor, an initial failure and forming a failure set of first-stage failures; setting a DC blocking or a counted number of searched failure stages reaching a threshold as a search stop condition;
   step 2: judging, using the processor, whether cascading failures in the current stage failure set can trigger a DC blocking; if the cascading failures cause the DC blocking, the DC blocking is stored, in a memory, in a next stage of the cascading failures; otherwise, using an outage risk value as a pruning basis to search the cascading failures on an AC side to determine a failure set of next stage failures; the search of the cascading failures on the AC side to determine the failure set of the next stage failures including:
   calculating, using the processor, the outage risk value of a line without failure of each failure chain in turn; the outage risk value of the failure chain is:

$R_i^m = p_i^m \times I_i^m$ where $p_i^m$ a failure probability of a line i, and $I_i^m$ is a consequence caused by a failure of the line i; and
   taking, using the processor, the outage risk values as the pruning basis, sequencing corresponding failure chains by the calculated outage risk values, storing, using the processor, a first preset number of the failure chains in the memory based on the outage risk values, and the failure set of the next stage failures is searched on the AC side; and
   step 3: if the search stop condition is satisfied, stopping, using the processor, the search; if the search stop condition is not satisfied, increasing, using the processor, the counted number of searched failure stages by one and returning to Step 2 to continue the search;
   step 4: outputting, using the processor, the failure chains with the highest outage risk values based on the search results.

2. The method according to claim 1, wherein, in the Step 1, according to an actual situation of a hybrid AC/DC power system, AC lines near a vicinity of a DC terminal location are selected as initial failures, and the initial failures are simulated in time-domain to check whether the initial failures will trigger the DC blocking.

3. The method according to claim 1, wherein,
   in the Step 2, when judging whether the cascading failures of the current stage failure set can trigger the DC blocking, extreme failures are identified by comparing a multi-infeed short circuit ratio (MISCR) with a preset threshold of MISCR; then, the extreme failures are judged whether the extreme failures are causing the DC blocking by time-domain simulations, and
   the MISCR is:

$$M_i = \frac{S_{aci}}{P_{deqi}} = \frac{1}{|Z_{eqii}|P_{di} + \sum_{j=1, j \neq i}^{n} |Z_{eqij}|P_{dj}}$$

where $S_{aci}$, is a short-circuit capacity of a commutation bus i; $P_{deqi}$ is DC power of an i-th DC system, MW;

$Z_{eqii}$ is a self-impedance of the commutation bus i; $Z_{eqij}$ is a mutual impedance of the commutation bus i and a communication bus j; $P_{di}$ is a power of DC system i; $P_{dj}$ is a power of DC system j.

4. The method according to claim 1, wherein, in the Step 2, when judging whether the cascading failures of the current stage failure set can trigger the DC blocking, a Levenberg-Marquarelt Neural Network (LMNN) is used to judge whether non-extreme failures of the current stage failure set can trigger the DC blocking.

5. The method according to claim 4, wherein, for the non-extreme failures, the using of the LMNN to judge whether the current stage failure set can trigger the DC blocking includes:
partitioning the AC/DC power system to be analyzed; a partition principle is that each DC system terminal location is as one area, cascading failure chains of different stages are randomly selected near a vicinity of the DC terminal location and as a training sample set;
for the training sample set, removing extreme cascading failure chains, and using the remaining non-extreme cascading failure chains for training of the LMNN;
utilizing the trained LMNN to quickly estimate a voltage dip degree of a commutation bus after failures and measure a severity of each of a plurality of AC failures; and
for the cascading failures of the current stage failure set having a severity that exceeds a preset threshold, using a time-domain simulation to verify whether the cascading failures of the current stage failure set having the severity that exceeds the preset threshold can cause the DC blocking.

6. The method according to claim 5, wherein, in the process of using the LMNN to quickly estimate whether the non-extreme failures of the current stage can trigger the DC blocking, failure chains are sorted according to the severity of each of the AC failures, and the most severe failure of the AC failures is simulated by the time-domain simulation; if the simulated failure will trigger the DC blocking, a next failure is simulated continually; otherwise, if the simulated failure will not trigger the DC blocking, not simulating the remaining failures.

7. The method according to claim 1, wherein
in the process of calculating the remaining line outage risk for each failure chain, the calculation is based on two aspects: the line outage probability and the line outage consequence,
the line outage probability of the line i is:

$p_i^m = 1-(1-p_i^{hf})(1-p_i^{ol})$, where $p_i^{hf}$ is a hidden failure probability of the line i after a m-stage failure, $p_i^{ol}$ is a failure probability of the line i after failures, and
the consequence of the line i failing is:

$$I_i^m = \sum_{j=1, j\neq i}^{n} \exp(2\eta_{ij}^{m+1} + \Delta\eta_{ij}^{m+1}),$$

where $I_i^m$ represents the consequence caused by the line i failure; $\eta_{ij}^{m+1}$ is a load rate of a line j after the line i failure; $\Delta\eta_{ij}^{m+1}$ represents a load rate change of the line j before and after the line failure.

8. The method according to claim 7, wherein the line outage probability considers an influence of line load rate and protective hidden failures on a line outage; wherein the higher the line load rate is, the greater the line outage probability is; a fluctuation of line power flow and heavy load of AC lines will trigger the protective hidden failures; and wherein the more severe the fluctuation of line power flow is and the higher the load rate is, the greater the probabilities of protective hidden failures are;
the load rate and distribution of remaining lines after a line outage are defined as consequences of the line outage; and the LODF method is used to calculate a power flow after the line outage.

9. A system for fast search of cascading failure in hybrid AC/DC power systems, the system comprising a processor; the processor being configured to perform the steps of:
determining an initial failure and form a failure set of first stage failures; setting a DC blocking or a counted number of searched failure stages reaching a threshold as a search stop condition;
judging whether cascading failures in the current stage failure set can trigger a DC blocking; if the cascading failures cause a DC blocking, storing, in a memory, the DC blocking in a next stage failure of the cascading failure; otherwise, using an outage risk value as a pruning basis to search the cascading failures on an AC side and to determine a failure set of next stage failures; the search of the cascading failures on the AC side to determine the failure set of the next stage failures including:
calculating the outage risk value of a line without failure of each failure chain in turn;
the outage risk value of the failure chain is:

$R_i^m = p_i^m \times I_i^m$ where $p_i^m$ a failure probability of a line i, and $I_i^m$ is a consequence caused by a failure of the line i; and
taking the outage risk values as the pruning basis, sequencing corresponding failure chains by the calculated outage risk values, storing a first preset number of the failure chains in the memory based on the outage risk values, and the failure set of the next stage failures is searched on the AC side;
if the search stop condition is satisfied, stopping the search; if the search stop condition is not satisfied, increasing the counted number of searched failure stages by one and returning to the previous step of judging whether the cascading failures in the current stage failure set can trigger the DC blocking to continue the search; and
outputting the failure chains with the highest outage risk values based on the search results.

* * * * *